(12) United States Patent
Kim et al.

(10) Patent No.: US 8,941,931 B2
(45) Date of Patent: Jan. 27, 2015

(54) CONCENTRATION-RATIO CONTROLLABLE SYSTEM IN THE SOLAR SIMULATOR FOR THE CONCENTRATE TYPE SOLAR CELLS

(71) Applicant: Korea Institute of Science and Technology, Seoul (KR)

(72) Inventors: Seong Il Kim, Seoul (KR); Young Hwan Kim, Seoul (KR); Won Jun Choi, Seoul (KR); Yong Tae Kim, Gyeonggi-do (KR)

(73) Assignee: Korea Institute of Science and Technology, Seoul (KR)

( * ) Notice: Subject to any disclaimer, the term of this patent is extended or adjusted under 35 U.S.C. 154(b) by 142 days.

(21) Appl. No.: 13/687,098

(22) Filed: Nov. 28, 2012

(65) Prior Publication Data

US 2013/0135758 A1    May 30, 2013

(30) Foreign Application Priority Data

Nov. 29, 2011 (KR) .................. 10-2011-0126210

(51) Int. Cl.
| | | |
|---|---|---|
| G02B 9/00 | (2006.01) | |
| G02B 3/08 | (2006.01) | |
| F24J 2/08 | (2006.01) | |
| H01L 31/052 | (2014.01) | |
| F24J 2/46 | (2006.01) | |

(52) U.S. Cl.
CPC . *G02B 3/08* (2013.01); *F24J 2/085* (2013.01); *H01L 31/0524* (2013.01); *Y02E 10/52* (2013.01); *F24J 2/4623* (2013.01); *Y02E 10/43* (2013.01)
USPC .......................................... 359/738; 359/811

(58) Field of Classification Search
CPC ........... F24J 2/085; F24J 2/4623; G02B 3/08; H01L 31/0524; Y02E 10/52
USPC .......................................... 359/738–740, 811
See application file for complete search history.

(56) References Cited

U.S. PATENT DOCUMENTS

| | | | | |
|---|---|---|---|---|
| 4,371,258 | A * | 2/1983 | Mast | 355/37 |
| 7,295,372 | B2 * | 11/2007 | Steneby | 359/592 |
| 2005/0039791 | A1 * | 2/2005 | Johnson | 136/259 |
| 2009/0195895 | A1 * | 8/2009 | Steneby | 359/811 |
| 2011/0169445 | A1 * | 7/2011 | Shirai | 320/101 |

FOREIGN PATENT DOCUMENTS

| | | |
|---|---|---|
| JP | 4-393562 B1 | 10/2009 |
| JP | 2010-016109 A | 1/2010 |

* cited by examiner

*Primary Examiner* — Thomas K Pham
*Assistant Examiner* — Vipin Patel
(74) *Attorney, Agent, or Firm* — Ladas & Parry LLP (57) ABSTRACT

Provided is a concentration ratio controlling apparatus for concentration type solar cells. The concentration ratio controlling apparatus may include a first condensing unit to primarily concentrate quantity of light that is irradiated from a light source; a second condensing unit disposed between a lower portion of the first condensing unit and a solar cell to secondarily concentrate the quantity of light that has passed through the first condensing unit and thereby irradiate the secondarily concentrated light toward the solar cell; an adjustment unit disposed in an optical path between the light source and the first condensing unit to adjust a concentration area of the first condensing unit based on an external force, and thereby adjust the quantity of light that is concentrated by the first condensing unit; and a control unit to analyze an input signal and thereby supply a corresponding drive control signal to the adjustment unit.

16 Claims, 10 Drawing Sheets

CONCENTRATION-RATIO CONTROLLABLE SYSTEM IN THE SOLAR SIMULATOR FOR THE CONCENTRATE TYPE SOLAR CELLS

CROSS-REFERENCE TO RELATED APPLICATION

This application claims priority to and the benefit of Korean Patent Application No. 10-2011-0126210 filed in the Korean Intellectual Property Office on Nov. 29, 2011, the entire contents of which are incorporated herein by reference.

BACKGROUND OF THE INVENTION (a) Field of the Invention

The present invention relates to a concentration ratio controlling apparatus for concentration type solar cells that may be mounted to a solar simulator used to measure a photoelectric conversion characteristic of a concentration type solar cell to thereby adjust a concentration ratio of sunlight to be a predetermined value.

(b) Description of the Related Art

Currently, people are facing problems such as a serious level of air pollution, depletion of natural resources, and the like. Due to depletion of resources and an increase in resource prices, research and development of clean and new renewable energy has been actively conducted. Examples of the clean and new renewable energy may include solar energy, wind energy, tidal energy, and the like. In particular, to efficiently use the solar energy, research and development of a solar cell has been continuously performed.

Even though a variety of materials have been developed to be used as a solar cell material, a single-crystalline silicon solar cell has been generally in the mainstream so far. Solar cells using polycrystalline silicon, amorphous silicon, a III-V compound semiconductor, a thin film type solar cell (copper-indium-gallium-selenide (CIGS)), a dye-sensitized material, and the like, in addition to single-crystalline silicon, have been developed. Among the various solar cells, a concentration type III-V compound semiconductor solar cell has been reported to have the most excellent efficiency while showing the photoelectric conversion efficiency of greater than or equal to 40%.

A concentration type solar cell decreases a system cost by using only a small size of an expensive solar cell and instead, applying an optical lens (Fresnel lens) and the like, thereby concentrating the sunlight to a solar cell. Even a silicon solar cell may concentrate light. However, silicon is an indirect transition type semiconductor and thus, when a temperature increases, the efficiency decrease sensitively. Accordingly, the silicon solar cell is used only for concentration of up to about 20 folds to 100 folds. The silicon solar cell may use concentrate light even over 100 folds. However, in this case, it is known that a device production cost increases and thus, there is no great return.

Unlike this, the III-V compound semiconductor has an excellent high temperature characteristic and excellent temperature stability and reliability, and also has a characteristic in which photoelectric conversion efficiency increases according to concentration. Accordingly, the III-V compound semiconductor is most suitable for a high concentration type photovoltaic system. In the case of a III-V compound semiconductor multi-junction solar cell, a highly efficient solar cell having the high photoelectric conversion efficiency of greater than or equal to 40% (40.7%, U.S.A. Spectrolab) has been currently developed. High magnification concentration of greater than or equal to 500 folds is possible. In the European countries, research on concentration of greater than or equal to 1000 folds is also ongoing. In the U.S.A., the European countries, and Japan, a variety of investments have been made in the field of the III-V compound semiconductor solar cell in the meantime. Currently, many researches are ongoing in order to develop a concentration type solar cell and a highly efficient solar cell.

A solar cell is an apparatus for converting optical energy of the sun to electrical energy. The solar cell has competitiveness when the solar cell has high efficiency in the case of the same area and a production cost is low. However, the concentration type solar cell using the III-V compound semiconductor or the silicon material is predicted to be capable of satisfying the above conditions and thus, many researches thereon are ongoing. It is known that the III-V compound semiconductor has an excellent high temperature characteristic and excellent temperature stability and reliability, and also has a characteristic in which photoelectric conversion efficiency increases according to concentration and thus, is most suitable for a high magnification concentration type photovoltaic system.

However, there is a limit in adjusting the quantity of light of a lamp that is a light source in order to concentrate light to be greater than or equal to 1 Sun ($100$ mW/cm$^2$), which is generally used, or to irradiate weak light to be less than or equal to 1 Sun by employing a solar simulator or an artificial solar test apparatus used to measure a characteristic of a solar cell indoors.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a concentration ratio controlling apparatus for concentration type solar cells that may adjust an opened area by mounting, at a lower position of a solar simulator, a concentration ratio controlling apparatus combined with an adjustment unit capable of controlling the opened area and thereby adjusting the adjustment unit, and as a result thereof, may adjust the quantity of the incident light, that is, a concentration ratio, that is irradiated toward the surface of a solar cell disposed below a condenser by varying the quantity of light incident through a Fresnel lens disposed in a lower portion of the condenser.

An exemplary embodiment of the present invention provides includes a first condensing unit to primarily concentrate quantity of light that is irradiated from a light source; a second condensing unit disposed between a lower portion of the first condensing unit and a solar cell to secondarily concentrate the quantity of light that has passed through the first condensing unit and thereby irradiate the secondarily concentrated light toward the solar cell; an adjustment unit disposed in an optical path between the light source and the first condensing unit to adjust a concentration area of the first condensing unit based on an external force, and thereby adjust the quantity of light that is concentrated by the first condensing unit; and a control unit to analyze an input signal and thereby supply a corresponding drive control signal to the adjustment unit.

The first condensing unit may include a Fresnel lens through which light incident in a direction vertical to a plane of incidence is refracted and thereby is concentrated on an area smaller than the plane of incidence. The second condensing unit may be formed as a lens in a shape of a right column, and the second condensing unit may be disposed in a lengthwise direction between the lower portion of the first condensing unit and the solar cell.

The adjustment unit may include: a first driving unit to drive in response to an input of a first drive control signal that is supplied from the control unit; a first panel connected to one side of the first driving unit to open or close a portion of covering the first condensing unit in response to driving of the first driving unit; a second driving unit to drive in response to an input of a second driving control signal that is supplied from the control unit; and a second panel connected to one side of the second driving unit to open or close a remaining portion of covering the first condensing unit in response to driving of the second driving unit.

Each of the first panel and the second panel may have a shape in which a rectangular thin film is curved at 90 degrees based on a center of a lengthwise direction, and curved inner portions of the first panel and the second panel may be disposed to face each other. The first driving unit and the second driving unit may be respectively connected to curved outer corner portions of the first panel and the second panel to guide reciprocal diagonal movement of the first panel and the second panel.

The adjustment unit may be disposed to cover a top surface of the first condensing unit, and may include a light transmission adjustment panel to maintain at least a portion in a transparent state, a translucent state, or an opaque state in response to an input of a light quantity transmissivity adjustment control signal that is supplied from the control unit.

The adjustment may include: a third driving unit to drive in response to an input of a third drive control signal that is supplied from the control unit; a variable iris connected to one side of the third driving unit to open or close a portion of covering the first condensing unit in response to driving of the third driving unit and thereby vary an opened and closed area of the first condensing unit; a housing having a space for including the variable iris, and formed with a combination of partially opened upper and lower circular plates to support an opening and closing operation of the variable iris as an external force is transferred through a side opening provided along a circumferential direction of the housing; and a knob portion of which one side is connected to the third driving unit, and another side is connected to the variable iris through the side opening of the housing to transfer power of the third driving unit to the variable iris. An opened surface of the adjustment unit according to the opening and closing operation of the variable iris may be in a circular shape or a polygonal shape.

According to the exemplary embodiments of the present invention, by installing, in a solar simulator, an adjustment unit capable of controlling an opened area and thereby adjusting the quantity of light coming from a lamp based on a size of the opened area of the adjustment unit, it is possible to control the quantity of light incident on a solar cell through a Fresnel lens.

Further, it is possible to adjust the quantity of light, that is, a concentration ratio, incident on the surface of a solar cell in correspondence to a change in the opened area of the adjustment unit.

In addition, it is possible to adjust a concentration ratio of a light source irradiated toward the solar cell to be various values by comparing the concentration ratio with 1 Sun (100 mW/cm$^2$).

Moreover, in a concentration type solar cell system, when a concentration ratio increases, a solar cell with a relatively small size compared to an area toward which the sunlight is irradiated is used. Therefore, it is possible to reduce a cost of a solar cell module and system.

DETAILED DESCRIPTION OF THE EMBODIMENTS

Professional terminology used herein is only to describe a predetermined exemplary embodiment and is not intended to limit the present invention. Unless sentences clearly indicate an opposite meaning, singular forms used herein also include plural forms. A meaning of "comprises/includes" used in the specification specifies a predetermined characteristic, area, integer, step, operation, element and/or component, and does not exclude presence or addition of another predetermined characteristic, area, integer, step, operation, element, component and/or group.

Unless differently defined, all of the terminologies including technical terminology and scientific terminology used herein have the same meaning as a meaning that is generally understood by those skilled in the art. Terminologies defined in a generally used dictionary are additionally interpreted to have a meaning that matches the relevant technical documents and currently disclosed descriptions, and, unless particularly defined, are not interpreted to have an idealistic or very official meaning.

The present invention will be described more fully hereinafter with reference to the accompanying drawings, in which exemplary embodiments of the invention are shown, and accordingly may be easily implemented by those skilled in the art. As those skilled in the art would realize, the described embodiments may be modified in various different ways, all without departing from the spirit or scope of the present invention.

Figure 1:
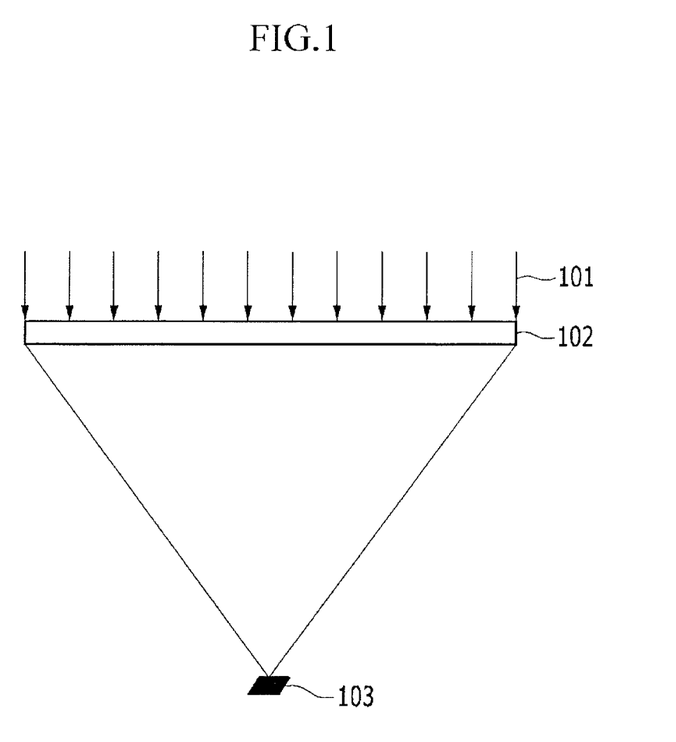
FIG. 1 is a drawing illustrating a state in which light incident in a direction vertical to a plane of incidence is refracted when passing through a first condensing unit and thereby is concentrated on an area smaller than the plane of incidence.

FIG. 1 is a drawing illustrating a state in which light incident in a direction vertical to a plane of incidence is refracted when passing through a first condensing unit 102 and thereby is concentrated on an area smaller than the plane of incidence. FIG. 1 illustrates a state in which light 101 coming from a light source of a solar simulator is irradiated toward a plane of incidence of the first condensing unit 102, and light having passed through the first condensing unit 102 is refracted and thereby is concentrated. Generally, the solar simulator complexly uses a xenon (Xe) lamp or a Xenon and halogen lamp. As a standard, optical power is set to a value of 1 Sun (100 mW/cm2). The first condensing unit 102 uses a convex lens or a Fresnel lens. Due to a characteristic of a lens, light that is incident to be in parallel with a direction vertical to the plane of incidence of the first condensing unit 102 passes through the first condensing unit 102 and then is refracted and thereby is concentrated on a small area. However, the above concentrated light does not have a uniform optical power distribution and has a bell-shaped Gaussian distribution in which optical power is very strong in a center portion and becomes weaker along getting closer to an edge. The above concentrated light is irradiated toward a solar cell 103.

Figure 2:
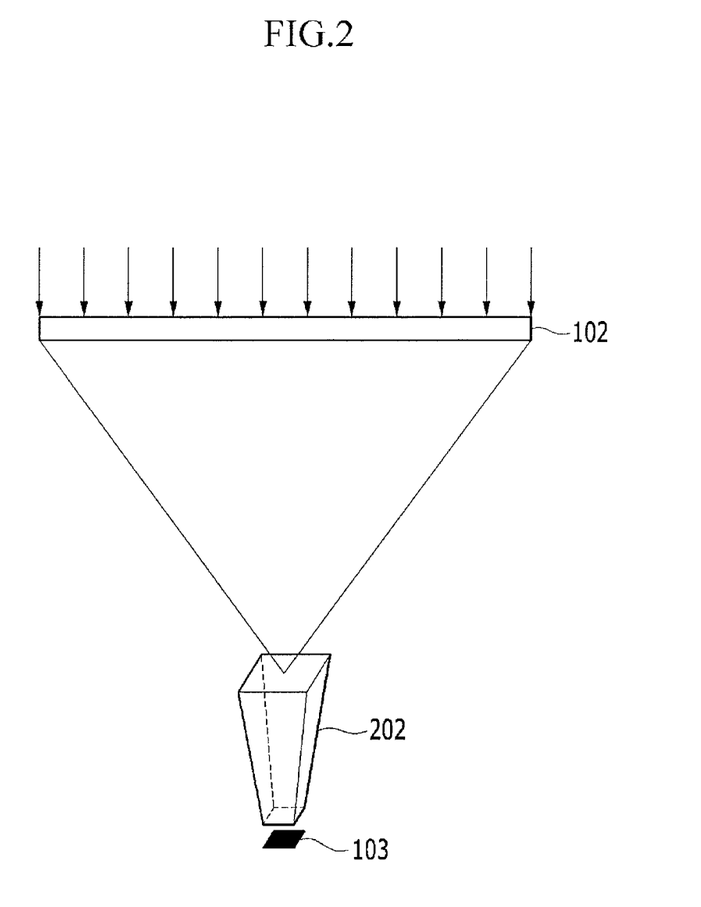
FIG. 2 is a drawing illustrating a state in which the primarily concentrated light of FIG. 1 is secondarily concentrated at a second condensing unit.

FIG. 2 is a drawing illustrating a state in which the primarily concentrated light 101 of FIG. 1 is secondarily concentrated at a second condensing unit 202.

Referring to FIG. 2, using the second condensing unit 202, it is possible to enable power of the light 101 incident on the surface of the solar cell 103 to be uniform.

When it is assumed that, in the case of concentrating all of the light incident on the entire area of the plane of incidence, the first condensing unit 102 has no loss, a value obtained by dividing an incidence area using an area of the solar cell 103 may be considered as a concentration ratio. However, in an actual environment, loss occurs while the light is refracted through the first condensing unit 102 and thereby is concentrated. Accordingly, to be accurate, an optical loss coefficient needs to be multiplied as expressed by Equation 1. The optical loss coefficient of the lens depends on a material that constitutes the lens, and has a value of about 0.8 to 0.95.

Concentration ratio=[area of lens($cm^2$)/area of solar cell($cm^2$)]*eta(optical loss coefficient of lens)     [Equation 1]

To concentrate light according to an exemplary embodiment of the present invention, parallel light incident from a light source may be enabled to have a uniform optical power distribution by collecting the incident light on a smaller area using the first condensing unit 102 and by employing the second condensing unit 202.

Figure 3:
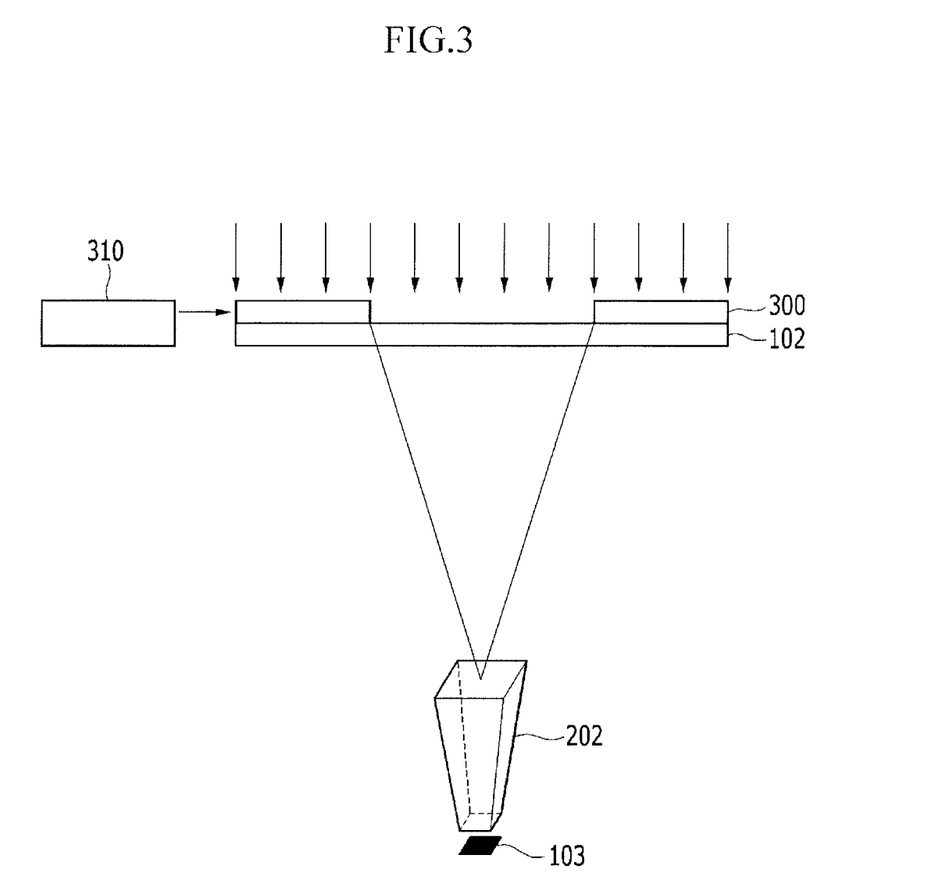
FIG. 3 is a drawing illustrating a concentration ratio controlling apparatus for concentration type solar cells according to an exemplary embodiment of the present invention.

FIG. 3 is a drawing illustrating a concentration ratio controlling apparatus for concentration type solar cells according to an exemplary embodiment of the present invention. Referring to FIG. 3, the concentration ratio controlling apparatus for concentration type solar cells includes the first condensing unit 102, the second condensing unit 202, an adjustment unit 300, and a control unit 310.

The first condensing unit 102 primarily concentrates quantity of light that is irradiated from a light source. The first condensing unit 102 may include a Fresnel lens through which light incident in a direction vertical to a plane of incidence is refracted and thereby is concentrated on an area smaller than the plane of incidence. The second condensing unit 202 is disposed between a lower portion of the first condensing unit 102 and the solar cell 103 to secondarily concentrate the quantity of light that has passed through the first condensing unit 102 and thereby irradiate the secondarily concentrated light toward the solar cell 103. The adjustment unit 300 is disposed between the light source and the first condensing unit 102 to adjust a concentration area of the first condensing unit 102 based on an external force, and thereby adjust the quantity of light that is concentrated by the first condensing unit 102. The control unit 310 performs a predetermined control operation of controlling an area of light that is irradiated toward the first condensing unit 102 through the adjustment unit 300. For the above operation, the control unit 310 analyzes an input signal and thereby supplies a corresponding drive control signal to the adjustment unit 300. The control unit 310 supplies a first drive control signal to a first driving unit 301, and supplies a second drive control signal to a second driving unit 302.

As described above, the concentration ratio controlling apparatus for concentration type solar cells according to an exemplary embodiment of the present invention includes the adjustment unit 300 capable of controlling the quantity of light incident through the first condensing unit 102 in order to control a concentration ratio when measuring a photoelectric conversion characteristic, and adjusts an irradiation area of the quantity of light that is incident through the first condensing unit 102 by adjusting an opened area of the adjustment unit 300. As a result, by varying the quantity of light incident through the first condensing unit 102 disposed below the adjustment unit 300, it is possible to adjust, to be a required ratio, the quantity of light, that is, a concentration ratio, that is irradiated toward the surface of the solar cell 103 disposed below the first condensing unit 102. Further, when transmitting the above concentrated light using the second condensing unit 202, it is possible to enable power of light irradiated toward the solar cell 103 to be uniform, and also to increase the concentration ratio.

Figure 4:
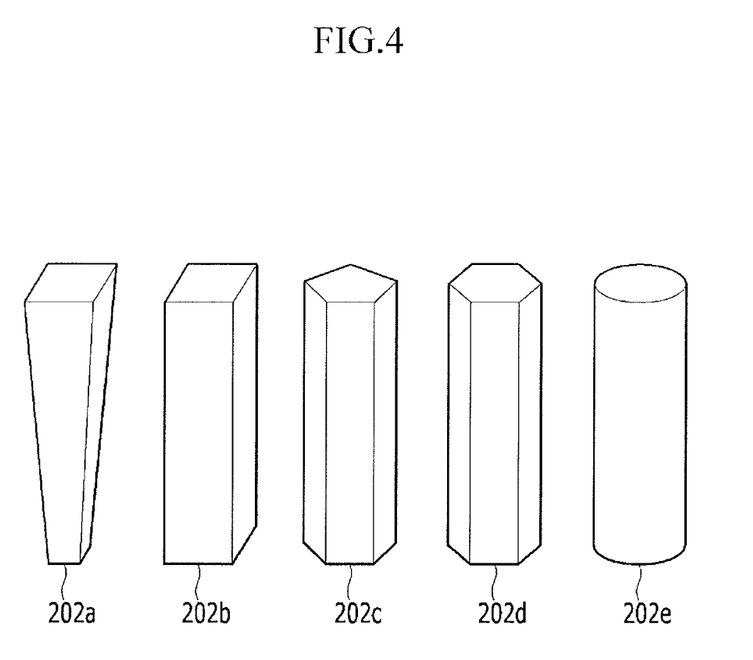
FIG. 4 is a drawing illustrating various shapes of a second condensing unit according to an exemplary embodiment of the present invention.

FIG. 4 is a drawing illustrating various shapes of a second condensing unit according to an exemplary embodiment of the present invention. Referring to FIG. 4, a second condensing unit 202a, 202b, 202c, 202d, or 202e is formed as a lens in a shape of a right column, and the second condensing unit 202a, 202b, 202c, 202d, or 202e is disposed in a lengthwise direction between the lower portion of the first condensing unit 102 and the solar cell 103. By forming the second condensing unit 202a, 202b, 202c, 202d, or 202e in the shape of the right column, it is possible to enable the power of light incident on the surface of the solar cell 103 to be further uniform. Even though a cuboid column, an inverted pyramid column, and the like may be used for the second condensing unit 202a, 202b, 202c, 202d, or 202e, the exemplary embodiment of the present invention does not require tracking and thus, it will be sufficient to use the right column shape for the second condensing unit 202a, 202b, 202c, 202d, or 202e. Even though BK7, quartz, and the like may be used for a material of the second condensing unit 202a, 202b, 202c, 202d, or 202e, it is desirable to use quartz having relatively excellent transmissivity characteristic and the like. Further, when using the second condensing unit 202a in an inverted pyramid shape, it is possible to enable the power of light irradiated toward the solar cell 103 to be uniform, and to further increase a concentration ratio.

Figure 5:
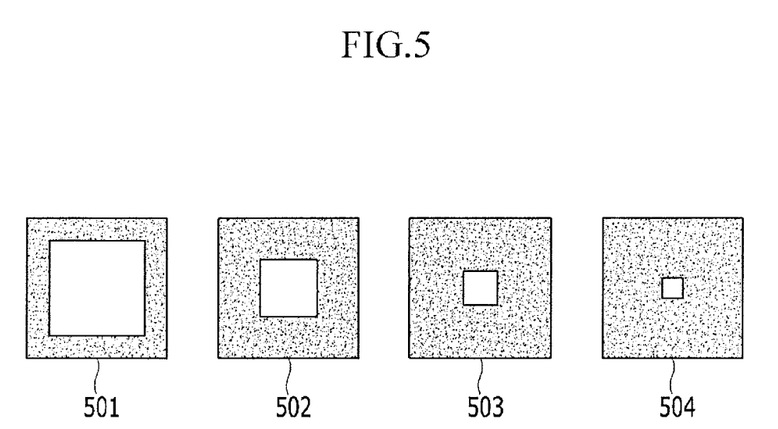
FIGS. 5 through 7 are drawings illustrating various concentration shapes of a second condensing unit according to an exemplary embodiment of the present invention.
Figure 6:
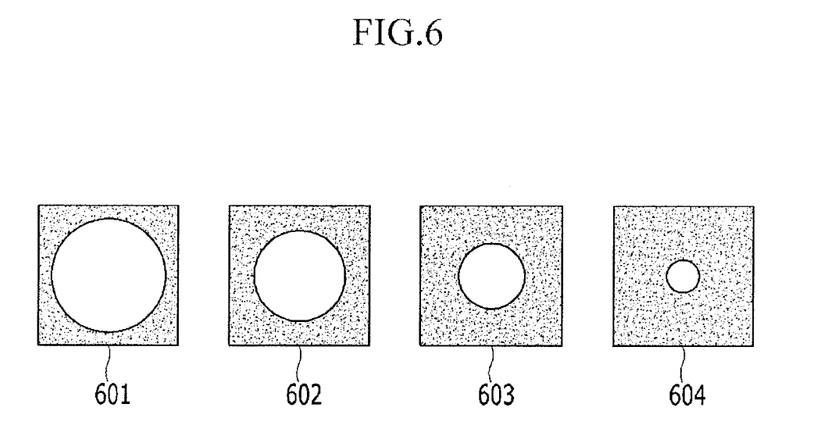
Figure 7:
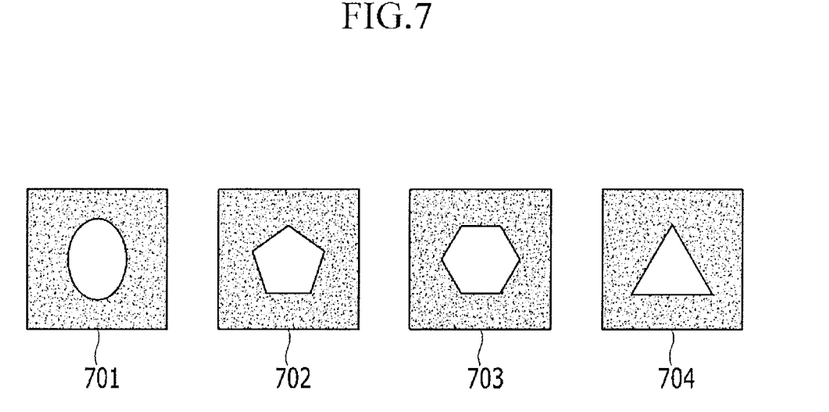

FIGS. 5 through 7 are drawings illustrating various concentration shapes of a second condensing unit according to an exemplary embodiment of the present invention. FIG. 5 illustrates four cases 501, 502, 503, and 504 of the adjustment unit 300. As one example, when it is assumed that, in the case of using a filter in which only a white portion of a center portion is opened as shown in the case 503, light of 1 Sun is concentrated, 16 Sun in the case 501, 4 Sun in the case 502, and 0.25 sun in the case 504 are irradiated toward the surface of the solar cell 103 disposed below the second condensing unit 202. As the opened area of the adjustment unit 300 becomes narrower, a smaller amount of light is concentrated through the first condensing unit 102 and thus, a concentration ratio further decreases. According to an exemplary embodiment of the present invention, by controlling the opened area of the adjustment unit 300, it is possible to manufacture an apparatus for concentrating very weak light (0.1 to 0.001 sun) or very strong light (1 to 1000 sun) compared to 1 sun. Even though a size of the second condensing unit 202 is uniform, a size of the solar cell 103 to be measured needs to be small in order to increase a concentration ratio. FIG. 5 illustrates a state in which the white portion of the center portion is formed in quadrangular shapes, and FIG. 6 illustrates a state in which the white portion of the center portion is formed in circular shapes 601, 602, 603, and 604. FIG. 7 illustrates a state in which the white portion of the center portion is formed in an oval shape 701, polygonal shapes 702 and 703, and a triangular shape 704.

An exemplary embodiment of the present invention relates to an apparatus capable of relatively easily varying an irradiation amount of the sunlight and a concentration ratio. By installing the adjustment unit 300 in a state in which power of a light source, a focus of a condensing lens, and the like are maintained to be the same, and by varying an opened window area through which the sunlight passes, it is possible to vary the quantity of light incident to the solar cell 103. Therefore, according to an exemplary embodiment of the present invention, while not adjusting optical power of a solar simulator, by irradiating, toward the surface of the solar cell 103, light having a uniform optical power distribution in which a concentration ratio is greater than or smaller than 1 Sun, it is possible to measure a characteristic of the solar cell 103 at a concentration ratio that is set arbitrarily based on a test condition.

Figure 8:
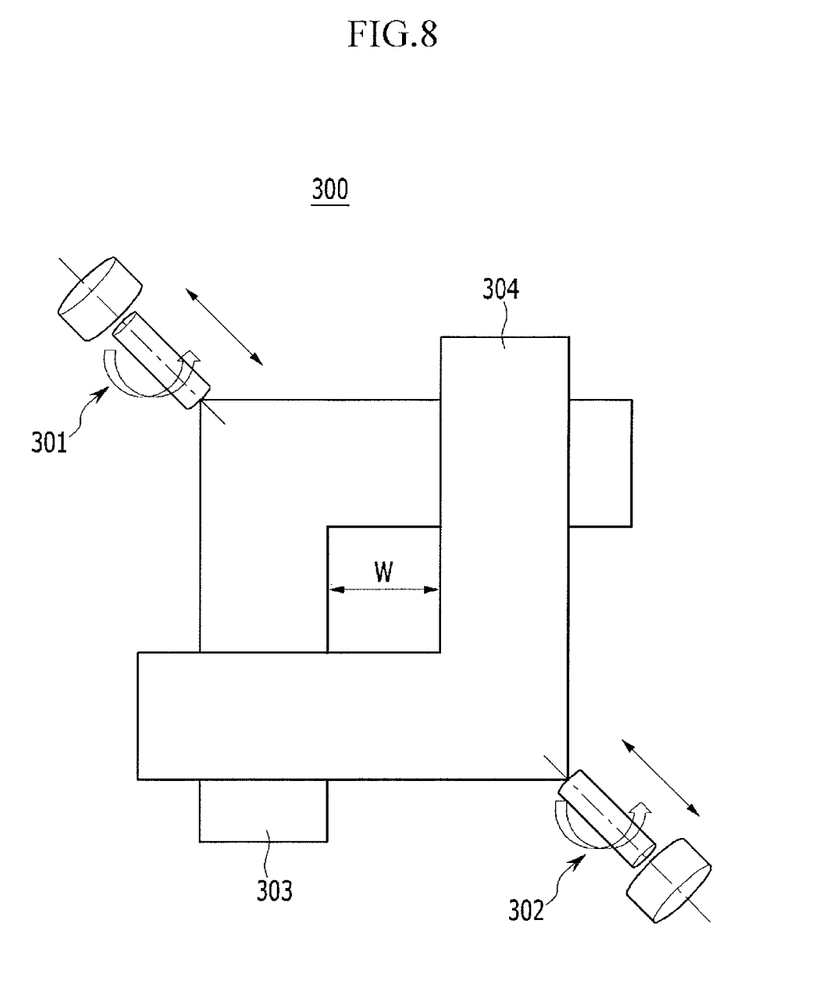
FIG. 8 is a drawing illustrating an area control state of an adjustment unit according to an exemplary embodiment of the present invention.

FIG. 8 is a drawing illustrating an area control state of the adjustment unit 300 according to an exemplary embodiment of the present invention. Referring to FIG. 8, the adjustment unit 300 includes the first driving unit 301, a first panel 303, the second driving unit 302, and a second panel 304. The first driving unit 301 drives in response to an input of a first drive control signal that is supplied from the control unit 310. The first panel 303 is connected to one side of the first driving unit 301 to open or close a portion of covering the first condensing unit 102 in response to driving of the first driving unit 301. The second driving unit 302 drives in response to an input of a second driving control signal that is supplied from the control unit 310. The second panel 304 is connected to one side of the second driving unit 302 to open or close a remaining portion of covering the first condensing unit 102 in response to driving of the second driving unit 302. Each of the first panel 303 and the second panel 304 has a shape in which a rectangular thin film is curved at 90 degrees based on a center of a lengthwise direction, and curved inner portions of the first panel 303 and the second panel 304 are disposed to face each other. Each of the first driving unit 301 and the second driving unit 302 may include a motor. The first driving unit 301 and the second driving unit 302 are respectively connected to curved outer corner portions of the first panel 303 and the second panel 304 to guide reciprocal diagonal movement of the first panel 303 and the second panel 304. When synchronizing and thereby moving the first driving unit 301 and the second driving unit 302 together, it is possible to adjust an opened area W of the adjustment unit 300 to be gradually opened or closed based on a center point of specimens of the solar cell 103 that is placed on a concentration plane. When automating control of the adjustment unit 300 as above, it is possible to automatically and relatively easily control a concentration ratio when measuring concentration. Further, to adjust the quantity of light that is incident through the first condensing unit 102, it is possible to adjust the opened area of the first condensing unit 102 to be a predetermined value by controlling driving of the adjustment unit 300.

Figure 9:
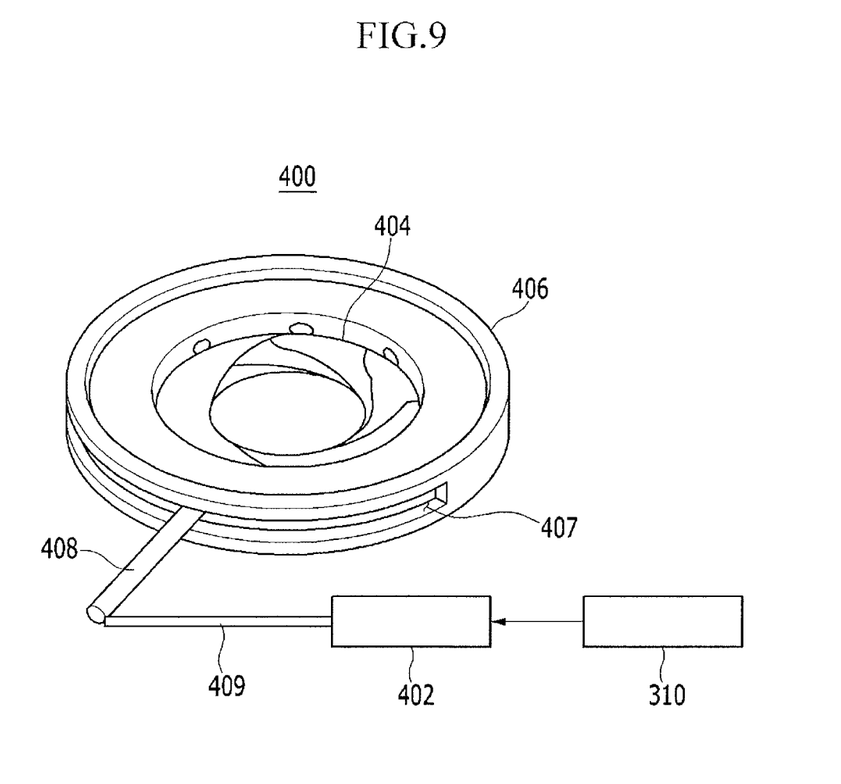
FIG. 9 is a drawing illustrating a state of controlling an opened surface of an adjustment unit using a variable iris according to another exemplary embodiment of the present invention.

FIG. 9 is a drawing illustrating a state of controlling an opened surface of an adjustment unit 400 using a variable iris 404 according to another exemplary embodiment of the present invention. Referring to FIG. 9, the adjustment unit 400 includes a third driving unit 402, the variable iris 404, a housing 406, and a knob 408. The third driving unit 402 drives in response to an input of a third drive control signal that is supplied from the control unit 310. The third driving unit 402 may include a motor and an external signal controlling apparatus. The variable iris 404 is connected to one side of the third driving unit 402 to open or close a portion of covering a first condensing unit in response to driving of the third driving unit 402 and thereby vary an opened and closed area of the first condensing unit. The variable iris 404 is formed so that the opened and closed surface may have a circular shape. The housing 406 has a space for including the variable iris 404, and is formed with a combination of partially opened upper and lower circular plates to support an opening and closing operation of the variable iris 404 as an external force is transferred through a side opening 407 provided along a circumferential direction of the housing 406. One side of the knob 408 is connected to a rod 409 of the third driving unit 402, and another side of the knob 408 is connected to the variable iris 404 through the side opening 407 of the housing 406 to transfer power of the third driving unit 402 to the variable iris 404.

The knob 408 interworking according to driving of the third driving unit 402 may open and close the variable iris 404 to vary the opened area of the adjustment unit 400. Through the above operation, it is possible to adjust the opened area of the adjustment unit 400 to gradually increase or decrease. As a result, the quantity of incident light varies and thus, it is possible to vary the quantity of light that is irradiated toward a solar cell disposed on the concentration plane. When automating control of the adjustment unit 400 as above, it is possible to automatically and relatively easily control a concentration ratio when measuring concentration. Further, to adjust the quantity of light that is incident through the first condensing unit, it is possible to adjust the opened area of the first condensing unit to a preset predetermined value by controlling driving of the adjustment unit 400.

Figure 10:
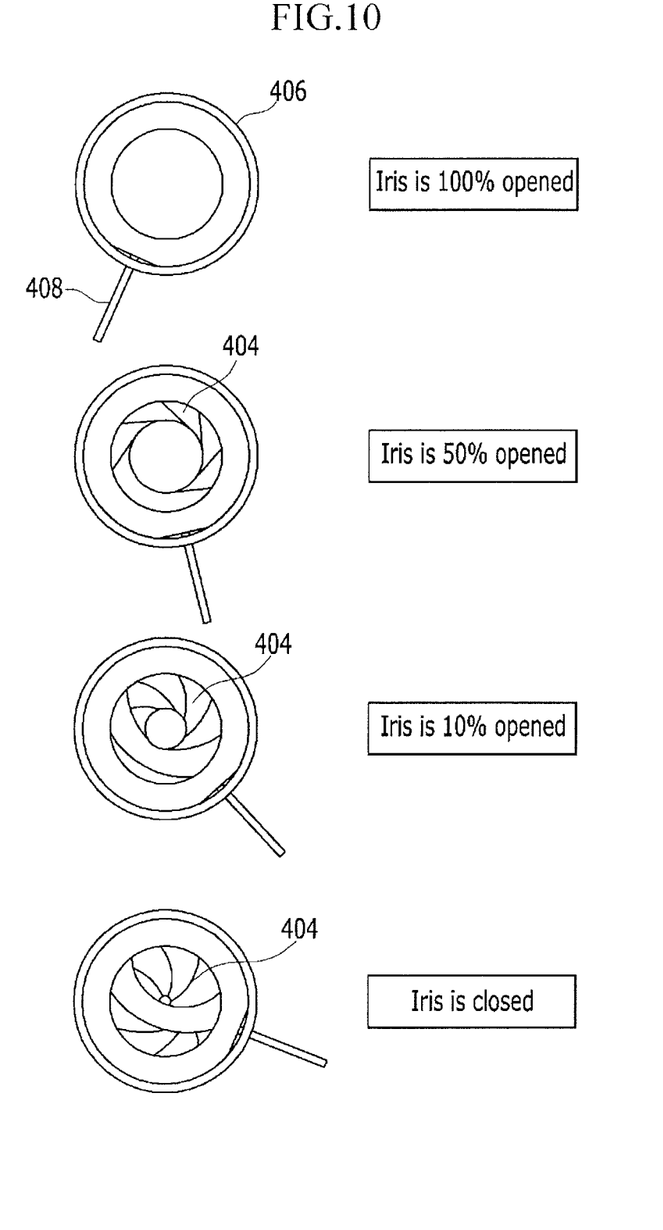
FIG. 10 is a drawing illustrating a state of varying an opened surface of an adjustment unit by controlling a variable iris according to another exemplary embodiment of the present invention.

FIG. 10 is a drawing illustrating a state of varying an opened surface of the adjustment unit 400 by controlling the variable iris 404 according to another exemplary embodiment of the present invention. Referring to FIG. 10, an opening and closing portion of the variable iris 404 may be in a circular shape or a polygonal shape. The variable iris 404 is connected to the knob 408 and thus, may be applied to a concentration ratio controlling apparatus for concentration type solar cells that may vary an opened and closed area of a condensing unit. As illustrated in FIG. 10, the knob 408 may be moved along an external force to vary the opened and closed area of the variable iris 404. Further, it is possible to manufacture a concentration ratio controlling apparatus for concentration type solar cells in which the adjustment unit 400 is disposed at a predetermined position in an optical path through which light concentrated by the first condensing unit, a Fresnel lens for concentration, or a solar concentration apparatus passes, to adjust an opened and closed area of light that passes the optical path, thereby controlling a concentration ratio.

A concentration ratio controlling method for concentration type solar cells according to an exemplary embodiment of the present invention will be described.

Initially, a concentration type solar cell using a III-V compound semiconductor or a silicon material includes a condensing lens and a solar cell, and has high efficiency and may obtain an electrical output similar to an output obtained when using a solar cell of the same lens size even though a small size of solar cell is used. Accordingly, the concentration type solar cell is in the spotlight. To develop the above concentration type solar cell, there is a need for a test apparatus that may measure or analyze a concentration characteristic.

According to an exemplary embodiment of the present invention, when measuring efficiency of the concentration type solar cell, a concentration ratio controlling apparatus mounted with the adjustment unit 300 capable of controlling an opened area through which the sunlight is incident is installed in a solar simulator from which parallel light or quantity of light similar to a parallel light source is irradiated in order to control a concentration ratio. An irradiation amount of the sunlight may be adjusted by adjusting a size of the opened area of the adjustment unit 300 based on a control operation of the control unit 310. As a result, when varying the quantity of light incident through the first condensing unit 102 disposed below the adjustment unit 300, it is possible to adjust the quantity of light, that is, a concentration ratio, that is irradiated toward on the surface of the solar cell 103 disposed below the first condensing unit 102.

A III-V compound semiconductor has a direct transition type band gap and thus, has a relatively high optical absorption rate compared to a silicon which has an indirect transition type band gap. Accordingly, even though a thickness of an active layer in III-V compound semiconductor solar cell is thinner than that of silicon solar cell, solar energy incident to the solar cell is further efficiently absorbed. Further, with the development in epitaxial growth technology such as metal organic chemical vapor deposition (MOCVD), molecular beam epitaxy (MBE), and the like, growth of a multi-junction structure is enabled. In this case, the usage efficiency of a solar spectrum is enhanced and thus, ultra highly efficient solar cell may be manufactured. In addition, the III-V compound semiconductor has an excellent high temperature characteristic and excellent temperature stability and reliability, and also has a characteristic in which photoelectric conversion efficiency increases according to concentration. Accordingly, the III-V compound semiconductor is most suitable for a high magnification concentration type photovoltaic system. Accordingly, interest on the III-V compound semiconductor solar cell is currently increasing.

According to an exemplary embodiment of the present invention, it is possible to control a concentration ratio of the sunlight that is irradiated toward a solar cell. There is a limit in adjusting the quantity of light of a lamp that is a light source in order to concentrate light to be greater than or equal to 1 Sun, or to irradiate weak light to be less than or equal to 1 Sun in a solar simulator or an artificial solar condition used to measure a characteristic of the solar cell indoors. Instead, in order to concentrate the light, a method of collecting incident parallel light, that is, the incident light on a small area using the first condensing unit 102 (using a convex lens or a Fresnel lens) is further advantageous. According to an exemplary embodiment of the present invention, to control a concentration ratio when measuring a photoelectric conversion characteristic of a concentration type solar cell, the adjustment unit 300 capable of controlling the quantity of light incident through the first condensing unit 102 is disposed between the light source and the solar cell 103. By adjusting the opened area of the adjustment unit 300 and thereby varying the quantity of light incident through the first condensing unit 102 disposed below the adjustment unit 300, it is possible to adjust, to be a required ratio, the quantity of light, that is, a concentration ratio, that is irradiated toward the surface of the solar cell 103 disposed below the first condensing unit 102.

As the concentration ratio of the concentration type solar cell increases, short-circuit current (Isc) linearly increases according to a concentration ratio. As the concentration ratio increases, open voltage (Voc) increases nonlinearly. Therefore, photoelectric conversion efficiency of the solar cell increases. However, as the concentration ratio increases, a size of the solar cell may be reduced and a price of the solar cell is very expensive compared to a lens used for concentration. Increasing of the concentration ratio is advantageous in lowering a system price. Currently, even though a lens and a module having a concentration ratio of 300 folds or 500 folds are generally used, research on enabling concentration up to 1000 folds is ongoing. Meanwhile, in the case of a standard solar cell measurement in which a temperature is constantly maintained (generally, 25 degrees), short-circuit current (Isc) increases up to some degrees to be in proportion to the concentration ratio. Accordingly, when the short-circuit current (Isc) is measured, it is also possible to relatively accurately calculate the concentration ratio.

Even though the concentration ratio controlling apparatus for concentration type solar cells capable of measuring a solar cell characteristic while varying a concentration ratio according to an exemplary embodiment of the present invention is described above, the adjustment unit 300 may be disposed to cover a top surface of the first condensing unit 102, and may include a light transmission adjustment panel to maintain at least a portion in a transparent state, translucent state, or an opaque state in response to an input of a light quantity transmissivity adjustment control signal that is supplied from the control unit 310. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A concentration ratio controlling apparatus for concentration type solar cells, the apparatus comprising:
    a first condensing unit to primarily concentrate a quantity of light that is irradiated from a light source;
    a second condensing unit disposed between a lower portion of the first condensing unit and a solar cell to secondarily concentrate the quantity of light that has passed through the first condensing unit and thereby irradiate the secondarily concentrated light toward the solar cell;
    an adjustment unit disposed in an optical path between the light source and the first condensing unit to adjust a concentration area of the first condensing unit based on an external force, and thereby adjust the quantity of light that is concentrated by the first condensing unit; and
    a control unit to analyze an input signal and thereby supply a corresponding drive control signal to the adjustment unit,
    wherein the adjustment unit includes:
    a first driving unit to drive in response to an input of a first drive control signal that is supplied from the control unit;
    a first panel connected to one side of the first driving unit to open or close a portion of covering the first condensing unit in response to driving of the first driving unit;
    a second driving unit to drive in response to an input of a second driving control signal that is supplied from the control unit; and
    a second panel connected to one side of the second driving unit to open or close a remaining portion of covering the first condensing unit in response to driving of the second driving unit, and
    wherein each of the first panel and the second panel has a shape in which a rectangular thin plate is curved at 90 degrees based on a center of a lengthwise direction, and curved inner portions of the first panel and the second panel are disposed to face each other.

2. The apparatus of claim 1, wherein:
the first condensing unit is a Fresnel lens through which light incident in a direction vertical to a plane of incidence is refracted and thereby is concentrated on an area smaller than the plane of incidence.

3. The apparatus of claim 2, wherein:
the second condensing unit is formed as a lens in a shape of a right column, and the second condensing unit is disposed in a lengthwise direction between the lower portion of the first condensing unit and the solar cell.

4. The apparatus of claim 1, wherein:
the first driving unit and the second driving unit are respectively connected to curved outer corner portions of the first panel and the second panel to guide reciprocal diagonal movement of the first panel and the second panel.

5. The apparatus of claim 1, wherein:
the adjustment unit is disposed to cover a top surface of the first condensing unit, and includes a light transmission adjustment panel to maintain at least a portion in a transparent state, a translucent state, or an opaque state in response to an input of a light quantity transmissivity adjustment control signal that is supplied from the control unit.

6. The apparatus of claim 1, wherein:
the adjustment further includes:
a third driving unit to drive in response to an input of a third drive control signal that is supplied from the control unit;
a variable iris connected to one side of the third driving unit to open or close a portion of covering the first condensing unit in response to driving of the third driving unit and thereby vary an opened and closed area of the first condensing unit;
a housing having a space for including the variable iris, and formed with a combination of partially opened upper and lower circular plates to support an opening and closing operation of the variable iris as an external force is transferred through a side opening provided along a circumferential direction of the housing; and
a knob portion of which one side is connected to the third driving unit, and another side is connected to the variable iris through the side opening of the housing to transfer power of the third driving unit to the variable iris.

7. The apparatus of claim 6, wherein: an opened surface of the adjustment unit according to the opening and closing operation of the variable iris is in a circular shape or a polygonal shape.

8. A concentration ratio controlling apparatus for concentration type solar cells, the apparatus comprising:
a first condensing unit to primarily concentrate quantity of light that is irradiated from a light source;
a second condensing unit disposed between a lower portion of the first condensing unit and a solar cell to secondarily concentrate the quantity of light that has passed through the first condensing unit and to irradiate the secondarily concentrated light toward the solar cell;
an adjustment unit disposed in an optical path between the light source and the first condensing unit to adjust a concentration area of the first condensing unit based on an external force, and to adjust a quantity of light that is concentrated by the first condensing unit, wherein the adjustment unit comprises:
a first driving unit to drive in response to an input of a first drive control signal that is supplied from a control unit;
a first panel connected to one side of the first driving unit to open or close a portion of covering the first condensing unit in response to driving of the first driving unit;
a second driving unit to drive in response to an input of a second driving control signal that is supplied from the control unit;
a second panel connected to one side of the second driving unit to open or close a remaining portion of covering the first condensing unit in response to driving of the second driving unit,
wherein each of the first panel and the second panel has a shape in which a rectangular thin plate is curved at 90 degrees based on a center of a lengthwise direction, and curved inner portions of the first panel and the second panel are disposed to face each other,
wherein the first driving unit and the second driving unit are respectively connected to curved outer corner portions of the first panel and the second panel to guide reciprocal diagonal movement of the first panel and the second panel;
a third driving unit to drive in response to an input of a third drive control signal that is supplied from the control unit;
a rod connected to the third driving unit;
a variable iris connected to one side of the third driving unit to open or close a portion of covering the first condensing unit in response to driving of the third driving unit and to vary an opened and closed area of the first condensing unit;
a housing having a space for including the variable iris, and formed with a combination of partially opened upper and lower circular plates to support an opening and closing operation of the variable iris as an external force is transferred through a side opening provided along a circumferential direction of the housing; and
a knob portion of which one side is connected to the third driving unit via the rod and another side of the knob portion is connected to the variable iris through the side opening of the housing to transfer power of the third driving unit to the variable iris; and
the control unit to analyze an input signal and to supply a corresponding drive control signal to the adjustment unit.

9. The apparatus of claim 8, wherein the first condensing unit is a Fresnel lens through which light incident in a direction vertical to a plane of incidence is refracted and concentrated on an area smaller than the plane of incidence.

10. The apparatus of claim 8, wherein the first condensing unit is a convex lens through which light incident in a direction vertical to a plane of incidence is refracted and concentrated on an area smaller than the plane of incidence.

11. The apparatus of claim 8, wherein the second condensing unit is formed as a lens in a shape of right column, and the second condensing unit is disposed in a lengthwise direction between the lower portion of the first condensing unit and the solar cell.

12. A concentration ratio controlling apparatus for concentration type solar cells, the apparatus comprising:
a first condensing unit to primarily concentrate quantity of light that is irradiated from a light source;
a second condensing unit disposed between a lower portion of the first condensing unit and a solar cell to secondarily concentrate the quantity of light that has passed through the first condensing unit and to irradiate the secondarily concentrated light toward the solar cell;

an adjustment unit disposed in an optical path between the light source and the first condensing unit to adjust a concentration area of the first condensing unit based on an external force, and to adjust a quantity of light that is concentrated by the first condensing unit, wherein the adjustment unit comprises:
  a first driving unit to drive in response to an input of a first drive control signal that is supplied from a control unit;
  a first panel connected to one side of the first driving unit to open or close a portion of covering the first condensing unit in response to driving of the first driving unit;
  a second driving unit to drive in response to an input of a second driving control signal that is supplied from the control unit;
  a second panel connected to one side of the second driving unit to open or close a remaining portion of covering the first condensing unit in response to driving of the second driving unit,
    wherein each of the first panel and the second panel has a shape in which a rectangular thin plate is curved at 90 degrees based on a center of a lengthwise direction, and curved inner portions of the first panel and the second panel are disposed to face each other,
    wherein the first driving unit and the second driving unit are respectively connected to curved outer corner portions of the first panel and the second panel to guide reciprocal diagonal movement of the first panel and the second panel;
  a third driving unit to drive in response to an input of a third drive control signal that is supplied from the control unit;
  a rod connected to the third driving unit;
  a variable iris connected to one side of the third driving unit to open or close a portion of covering the first condensing unit in response to driving of the third driving unit and to vary an opened and closed area of the first condensing unit; and
  a housing having a space for including the variable iris, and formed with a combination of partially opened upper and lower circular plates to support an opening and closing operation of the variable iris as an external force is transferred through a side opening provided along a circumferential direction of the housing; and
  the control unit to analyze an input signal and to supply a corresponding drive control signal to the adjustment unit.

13. The apparatus of claim 12, wherein the adjustment unit further comprises a knob portion of which one side is connected to the third driving unit via the rod and another side of the knob portion is connected to the variable iris through the side opening of the housing to transfer power of the third driving unit to the variable iris.

14. The apparatus of claim 12, wherein the first condensing unit is a Fresnel lens through which light incident in a direction vertical to a plane of incidence is refracted and concentrated on an area smaller than the plane of incidence.

15. The apparatus of claim 12, wherein the first condensing unit is a convex lens through which light incident in a direction vertical to a plane of incidence is refracted and concentrated on an area smaller than the plane of incidence.

16. The apparatus of claim 12, wherein the second condensing unit is formed as a lens in a shape of right column, and the second condensing unit is disposed in a lengthwise direction between the lower portion of the first condensing unit and the solar cell.

* * * * *